(12) United States Patent
Chen

(10) Patent No.: US 10,504,872 B2
(45) Date of Patent: Dec. 10, 2019

(54) METHOD OF BATCH TRANSFERRING MICRO SEMICONDUCTOR STRUCTURES

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 0 days.

(21) Appl. No.: 15/947,178

(22) Filed: Apr. 6, 2018

(65) Prior Publication Data

US 2018/0294248 A1  Oct. 11, 2018

(30) Foreign Application Priority Data

Apr. 6, 2017  (TW) .............................. 106111526 A

(51) Int. Cl.
*H01L 23/00* (2006.01)
*H01L 21/683* (2006.01)
(Continued)

(52) U.S. Cl.
CPC .......... *H01L 24/97* (2013.01); *H01L 21/6836* (2013.01); *H01L 24/29* (2013.01);
(Continued)

(58) Field of Classification Search
CPC . H01L 25/0753; H01L 21/6836; H01L 24/83; H01L 2221/68354;
(Continued)

(56) References Cited

U.S. PATENT DOCUMENTS

| 5,905,099 A | * | 5/1999 | Everaerts | ................ B32B 27/08 |
| | | | | 522/126 |
| 2010/0027294 A1 | * | 2/2010 | Lee | .......................... G02B 5/02 |
| | | | | 362/620 |

FOREIGN PATENT DOCUMENTS

TW         M423420 U1    2/2012
TW       201227915 A1    7/2012
(Continued)

OTHER PUBLICATIONS

Tze-Min Lin; "Discussion on technology and layout of Taiwan's next generation display device." presentation post by Industrial Economics and Knowledge Conference, Sep. 26, 2016; pp: 1-34, Industrial Technology Research Institute.
(Continued)

*Primary Examiner* — Yasser A Abdelaziez
(74) *Attorney, Agent, or Firm* — Muncy, Geissler, Olds & Lowe, P.C.

(57) ABSTRACT

A method of batch transferring micro semiconductor structures is provided for effectively and efficiently picking up a batch of or a large amount of micro structures and transferring them to a target substrate, so it can be widely applied in transferring a lot of various micro semiconductor structures. The method includes steps of: attaching an adhesive material to a plurality of array-type micro semiconductor structures; and providing a roll-to-attach mechanism for alternately processing linear contacts between the array-type micro semiconductor structures and a target substrate. The array-type micro semiconductor structures are optionally picked up in batch from the adhesive material and transferred in batch to the target substrate as the linear contacts are alternately processed.

26 Claims, 18 Drawing Sheets

(51) Int. Cl.
  *H01L 25/00* (2006.01)
  *H01L 25/075* (2006.01)
  *H01L 33/00* (2010.01)
(52) U.S. Cl.
  CPC .......... *H01L 24/83* (2013.01); *H01L 25/0753* (2013.01); *H01L 25/50* (2013.01); *H01L 33/0095* (2013.01); H01L 2221/68368 (2013.01); H01L 2224/95115 (2013.01); H01L 2924/12041 (2013.01)
(58) Field of Classification Search
  CPC . H01L 2221/68368; H01L 2224/95115; H01L 24/97; H01L 33/0095; H01L 25/50; H01L 24/29; H01L 2924/12041; H01L 2224/9515; H01L 2221/68381
  See application file for complete search history.

(56) References Cited

FOREIGN PATENT DOCUMENTS

| TW | 201330320 A1 | 7/2013 | |
|---|---|---|---|
| WO | WO-2017037475 A1 * | 3/2017 | ........... H01L 27/156 |
| WO | WO-2017141013 A1 * | 8/2017 | ............. H01L 24/75 |

OTHER PUBLICATIONS

Wang et al., "From Micron to the World—The Status of Micro LED Display Technology Market", Industrial Materials Magazine, Oct. 2016, 358, pp. 127-135.

* cited by examiner

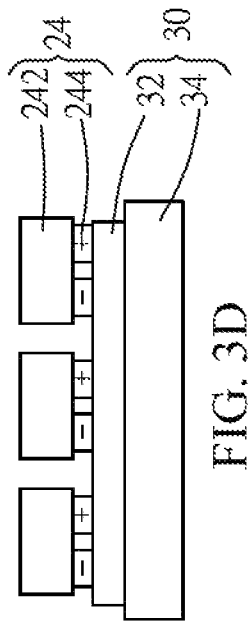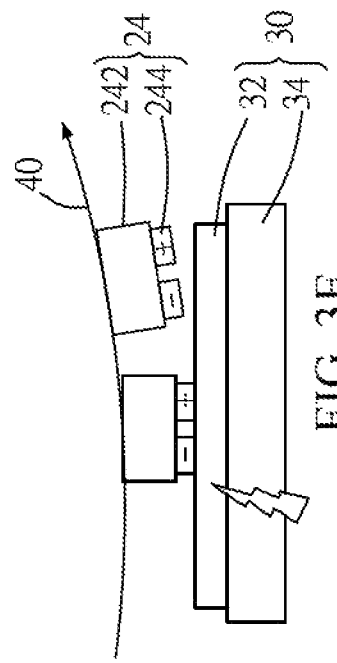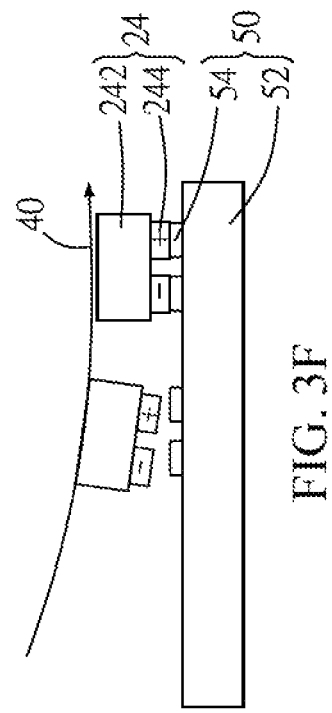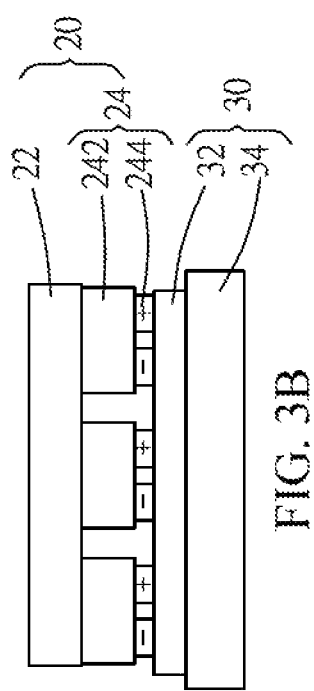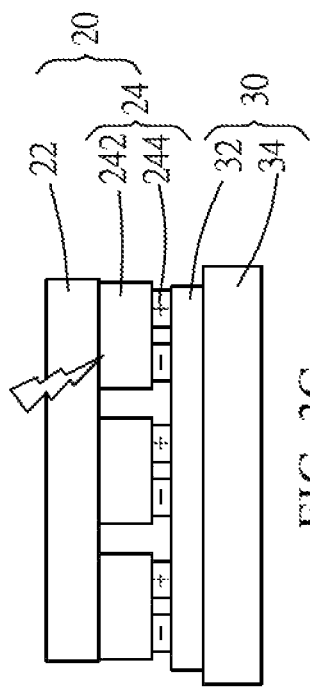

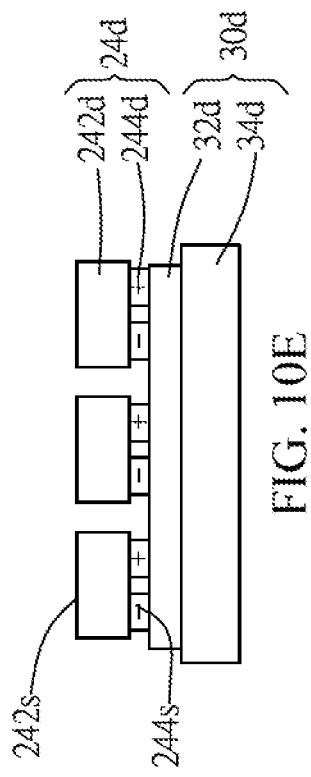
FIG. 10A
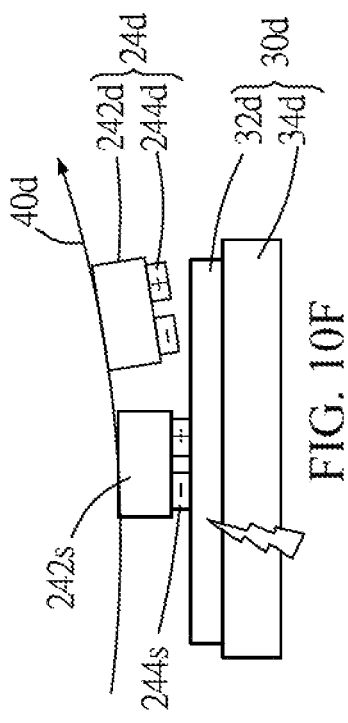
FIG. 10C
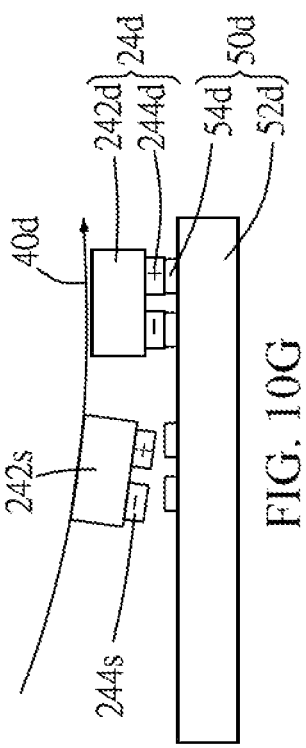
FIG. 10E
FIG. 10B
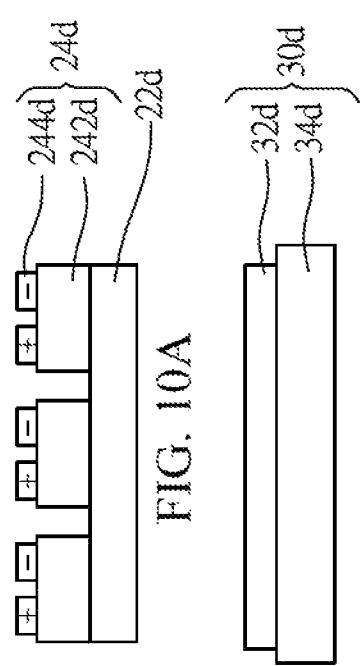
FIG. 10D
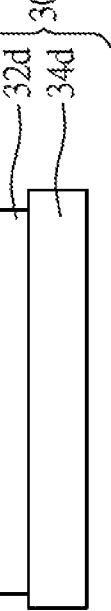
FIG. 10F
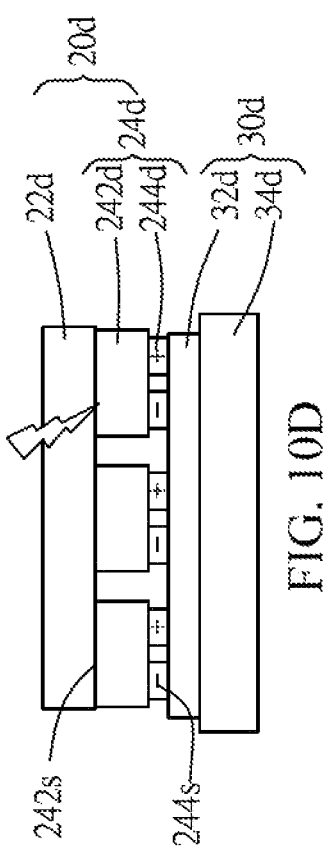
FIG. 10G

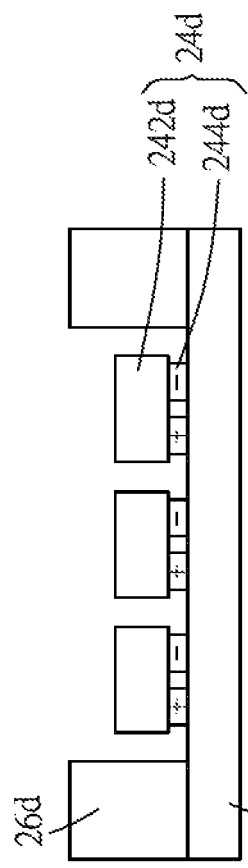
FIG. 15A
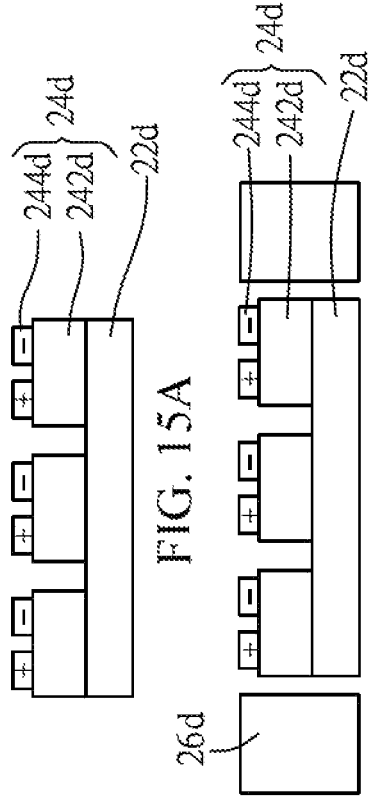
FIG. 15B
FIG. 15C
FIG. 15D
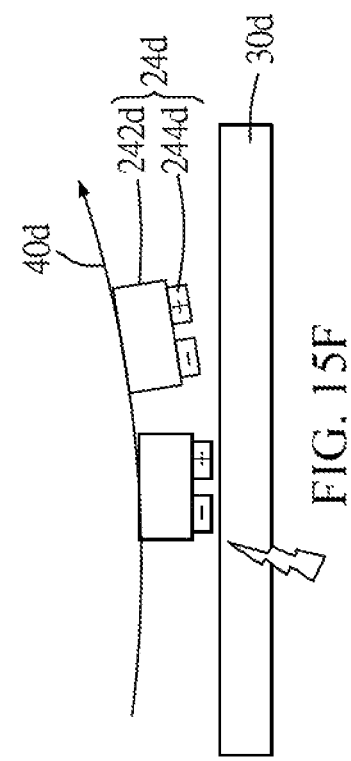
FIG. 15E
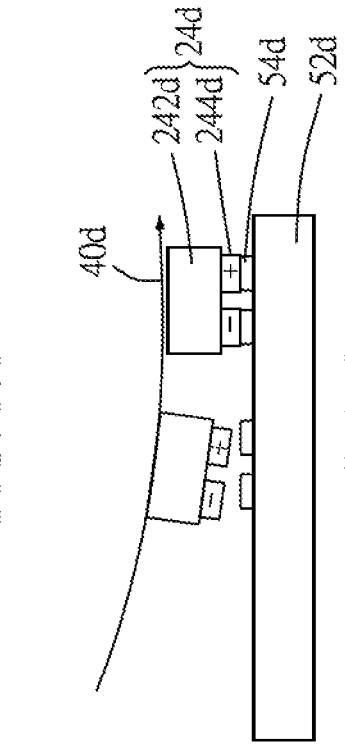
FIG. 15F
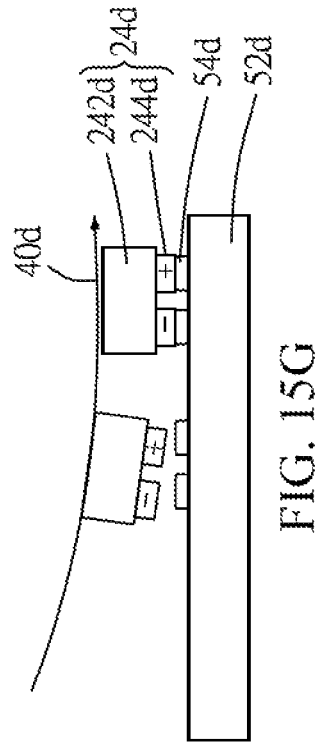
FIG. 15G

US 10,504,872 B2

METHOD OF BATCH TRANSFERRING MICRO SEMICONDUCTOR STRUCTURES

CROSS REFERENCE TO RELATED APPLICATIONS

This Non-provisional application claims priority under 35 U.S.C. § 119(a) on Patent Application No(s). 106111526 filed in Taiwan, Republic of China on Apr. 6, 2017, the entire contents of which are hereby incorporated by reference.

BACKGROUND

Technology Field

The present disclosure relates to a manufacturing process of semiconductor structures, and in particular, to a batch transferring process of semiconductor structures.

Description of Related Art

In a briefing entitled "Discussion of Display Technologies and Layout of Next Generation in Taiwan" published by the ITRI in September 2016, which made a comparison between micro LEDs and flexible AMOLEDs, it is found that the lifetime, energy consumption, viewing angle and resolution of micro LEDs are superior to those of flexible AMOLEDs. The briefing also notes that the micro LEDs may have some technical limitations such as the circuit drive designs, LED uniformity, transfer technology for huge amount of workpieces. In addition, another article "From micron to the world" (Industrial Materials Magazine No. 358, October 2016) also highly affirmed the technological advantages of micro LEDs.

In the conventional manufacturing process of LED (having a length over 100 micrometers), a plurality of individually independent and arrayed LED dies are manufactured after the epitaxial process, half cutting (electrical insulation), testing, and full cutting. Then, a pick-up head is used to select and transfer the LED dies one by one to a carrier substrate. However, in the micronization of LEDs, the conventional process may encounter several difficulties. For example, the edge length of the micro LED die is relatively smaller (e.g. 100 micron or less), so the pick-up head, which has limitation in scale minimization, cannot effectively pick up the micro LED dies. For another example, the micronization of the die size means that the number of the same sized wafer can be greatly increased. Unfortunately, the conventional process of picking and transferring the LED dies one by one cannot meet the needs of huge amount of manufactured LED dies and will result in a very low yield. Obviously, with the market's development towards the micron level or smaller. In addition to the existing demand for the micro LED dies, the micronization of the semiconductor structures/devices will be also required, and it is desired to develop an efficient massive transfer technology therefor.

SUMMARY

In view of the foregoing, the disclosure is to provide a method of batch transferring micro semiconductor structures, which can effectively and efficiently pick up and transfer a batch of or a huge amount of micro semiconductor structures and can be widely applied to the art of transferring various micro semiconductor structures in batch or in a huge amount.

To achieve the above, the disclosure provides a method of batch transferring micro semiconductor structures, which includes: attaching an adhesive material to a semiconductor device, wherein the semiconductor device includes a native substrate and array-type micro semiconductor structures grown on the native substrate, and the array-type micro semiconductor structures define a plurality of micro semiconductor structures arranged in an array; removing the native substrate from the semiconductor device and remaining the array-type micro semiconductor structures on the adhesive material; and providing a roll-to-attach mechanism for alternately processing linear contacts between the array-type micro semiconductor structures and a target substrate, wherein the array-type micro semiconductor structures are optionally picked up in batch from the adhesive material and transferred in batch to the target substrate as the linear contacts are alternately processed.

BRIEF DESCRIPTION OF THE DRAWINGS

The disclosure will become more fully understood from the detailed description and accompanying drawings, which are given for illustration only, and thus are not limitative of the present disclosure, and wherein:

FIGS. 3A to 3F are schematic diagrams showing the manufacturing processes of FIG. 1;

FIGS. 10A to 10G are schematic diagrams showing the manufacturing process of FIG. 9;

FIGS. 15A to 15G are schematic diagrams showing the manufacturing process of FIG. 14;

DETAILED DESCRIPTION OF THE DISCLOSURE

A method of batch transferring micro semiconductor structures of this disclosure is used to pick up array-type micro-scaled structures/devices in batch and integrate them on to a non-native substrate without damaging the structures/devices. The present disclosure will be apparent from the following detailed description, which proceeds with reference to the accompanying drawings, wherein the same references relate to the same elements.

In the following, the terms "semiconductor structure" and "semiconductor device" are synonyms generally referring to a semiconductor material, die, structure, device, component of a device, or semi-finished product. The term "micro" of micro semiconductor structures and micro semiconductor devices generally refers to microscales. Semiconductor devices include high-quality monocrystalline semiconductors and polycrystalline semiconductors, semiconductor materials fabricated by high temperature processing, doped semiconductor materials, organic and inorganic semiconductors, and combinations of semiconductor materials and structures having one or more additional semiconductor components or non-semiconductor components (such as dielectric layers or materials, or conductive layers or materials). Semiconductor devices include, but are not limited to, transistors, photovoltaic devices including solar cells, diodes, light-emitting diodes, laser diodes, p-n junction diodes, photodiodes, integrated circuits, and sensors. In addition, a semiconductor device may refer to a component or portion of a functional semiconductor device or product.

In the following, the term "target substrate" refers to a non-native substrate for receiving the "micro semiconductor structures". The material of the native substrate or non-native substrate includes polymers, plastics, resins, polyimide, polyethylene naphthalate, polyethylene terephthalate, metal, foil, glass, flexible glass, semiconductor, sapphire, thin film transistor (TFT), or the likes.

For ease of understanding and explanation, the "micro semiconductor structure" used herein is exemplified by a micro LED (light-emitting diode) die, or a semi-finished product of a plurality of micro semiconductor structures that has been formed with at least one epitaxial layer and has been defined. The "semiconductor device" includes a "micro semiconductor structure" and a wafer for growing a "micro semiconductor structure." The "target substrate" as used herein is exemplified by a thin film transistor.

First Embodiment

FIGS. 1, 2A, 2B, and 3A to 3F are schematic diagrams showing the flow chart and manufacturing process of the method of batch transferring micro semiconductor structures of this disclosure.

Figure 2B:
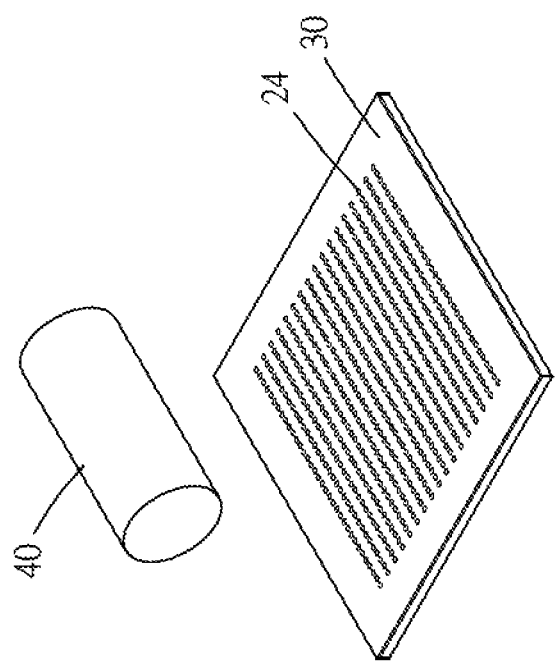
FIGS. 2A and 2B are schematic diagrams showing the concept of the method of batch transferring micro semiconductor structures of the disclosure.
Figure 2A:
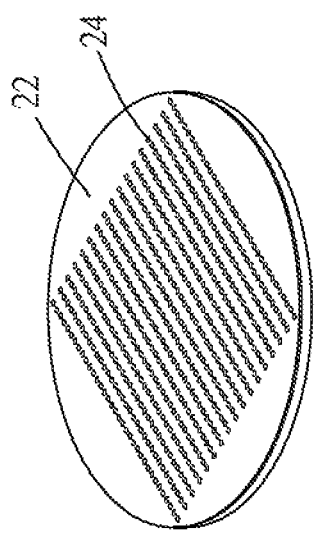

With reference to FIG. 2A, a semiconductor device 20 includes a native substrate 22 and array-type micro semiconductor structures 24 grown on the native substrate 22. The definition of the array-type micro semiconductor structures 24 is a plurality of micro semiconductor structures arranged in an array. Alternatively, the array-type micro semiconductor structures 24 may include a plurality of individual micro LED dies fabricated by complete manufacturing processes. In addition, the array-type micro semiconductor structures 24 may include a structure layer 240, which is defined to form a plurality of micro semiconductor semi-structures 242 (see FIG. 5A), and the residual processes (e.g. electrode 244) can be performed in the implementation steps.

Figure 1:
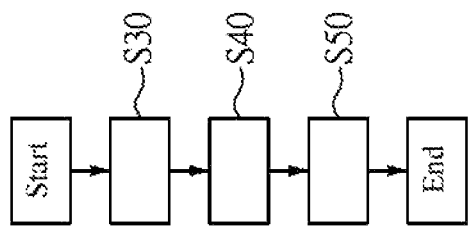
FIG. 1 is a flow chart of a method of batch transferring micro semiconductor structures according to a first embodiment of the disclosure.

As shown in FIG. 1, the method of batch transferring micro semiconductor structures of this disclosure at least includes the following steps S30, S40 and S50.

Referring to FIGS. 3A and 3B, the step S30 is to attach an adhesive material 30 on the semiconductor device 20 as shown in FIG. 2.

Referring to FIGS. 3C and 3D, the step S40 is to remove the native substrate 22 from the semiconductor device 20, so that the array-type micro semiconductor structures 24 as shown in FIG. 2B can be remained on the adhesive material 30.

Referring to FIGS. 3E and 3F, the step S50 is to provide a roll-to-attach mechanism for alternately processing linear contacts between the array-type micro semiconductor structures 24 and a target substrate 50. In this step, the array-type micro semiconductor structures 24 are optionally picked up in batch from the adhesive material 30 and transferred in batch to the target substrate 50 as the linear contacts are alternately processed.

The adhesiveness between the array-type micro semiconductor structures 24 and the adhesive material 30, the adhesiveness between the array-type micro semiconductor structures 24 and the roll-to-attach mechanism, and the adhesiveness between the array-type micro semiconductor structures 24 and the target substrate 50 are different. The roll-to-attach mechanism is configured to carry the array-type micro semiconductor structures 24 to generate linear contacts with the target substrate 50. Due to the different adhesiveness, the array-type micro semiconductor structures 24 can be moved from the adhesive material 30 to the target substrate 50, thereby achieving the picking up in batch and transferring in batch. In this embodiment, the roll-to-attach mechanism includes at least one attaching roller disposed between the array-type micro semiconductor structures 24 and the target substrate 50. Herein, the array-type micro semiconductor structures 24 and the target substrate 50 can be separately or both adjacent to the substrate (in a planar surface) or to the roller (in a curved surface). As the array-type micro semiconductor structures 24 and the attaching roller approach to each other, the attaching roller and the target substrate 50 approach to each other in order, and a linear contact is generated between any two approaching components of the three ones. Accordingly, a plane-roller liner contact or a roller-roller linear contact can be provided between the array-type micro semiconductor structures 24 and the attaching roller, and a roller-plane liner contact or a roller-roller linear contact can be provided between the attaching roller and the target substrate 50.

Accordingly the above theory, the attaching roller can be substituted by an attaching plane, and the array-type micro semiconductor structures 24 and the target substrate 50 are disposed on a roller. This configuration can also provide the desired linear contacts between any two of the three components.

The linear contacts are listed in the following Table 1. Herein, the "attaching roller" and the "attaching plane" are named by a general term "an attaching unit".

TABLE 1

| arrangement | array-type micro semiconductor structures and attaching unit | attaching unit and target substrate |
|---|---|---|
| I | plane-roller linear contact | roller-plane linear contact |
| II | plane-roller linear contact | roller-roller linear contact |
| III | roller-roller linear contact | roller-roller linear contact |
| IV | roller-roller linear contact | roller-plane linear contact |
| V | roller-plane linear contact | plane-roller linear contact |

The first to fourteenth embodiments and the modifications thereof will be described hereinafter, wherein the components are in the arrangement I: "the plane-roller linear contact is provided between the array-type micro semiconductor structures and the attaching unit" and "the roller-plane linear contact is provided between the attaching unit and the target substrate".

Referring to FIGS. 3E and 3F, the roll-to-attach mechanism includes an attaching roller 40 for performing a rolling motion. The attaching roller 40 is disposed between the array-type micro semiconductor structures 24 and the target substrate 50 for performing a rolling motion. In the step S50, the attaching roller 40 is rolling to generate a linear contact with the array-type micro semiconductor structures 24 as shown in FIGS. 2B and 3E and to pick up the micro semiconductor structures 24 in batch from the adhesive material 30. Then, the attaching roller 40 generates a linear contact with the target substrate 50 as shown in FIG. 3F so as to transfer the picked micro semiconductor structures 24 to the target substrate 50 in batch. The above-mentioned linear contacts are continuous and repeated, so that the array-type micro semiconductor structures 24 can be moved from the adhesive material 30 to the target substrate 50 in a desired arrangement.

Second Embodiment

FIGS. 4, 5A, 5B, and 6A to 6D show a modified flow chart of FIG. 2, wherein the steps referring to similar indications and functions will use the same reference numbers.

Figure 4:
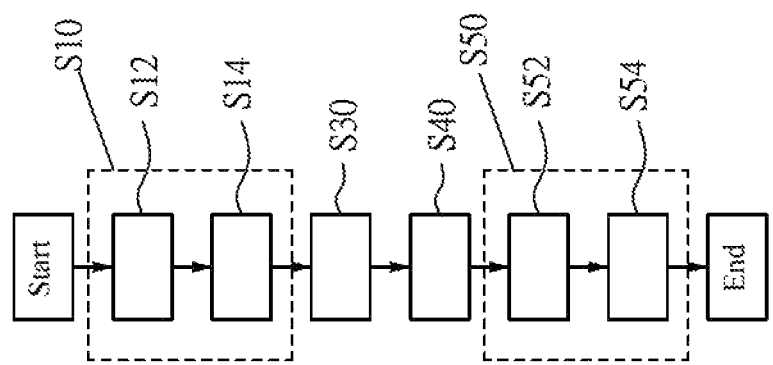
FIG. 4 is a flow chart of a method of batch transferring micro semiconductor structures according to a second embodiment of the disclosure.
Figure 5A:
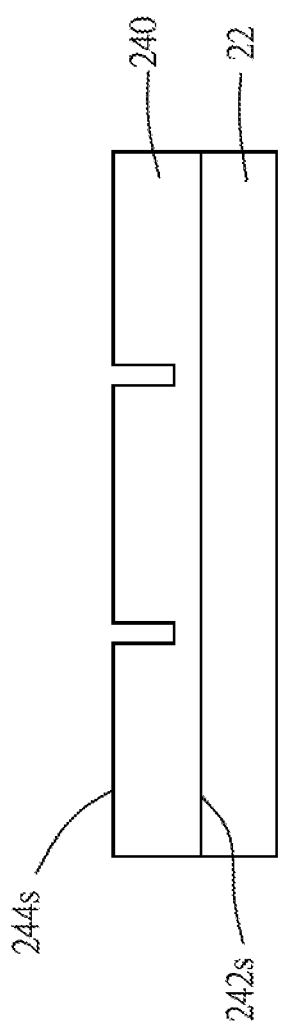
FIGS. 5A and 5B are schematic diagrams showing some manufacturing processes of FIG. 4.
Figure 5B:
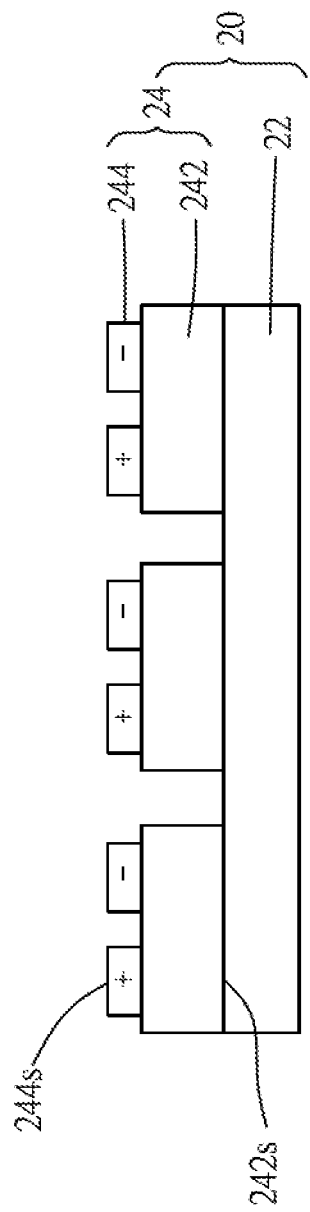
Figure 6A:
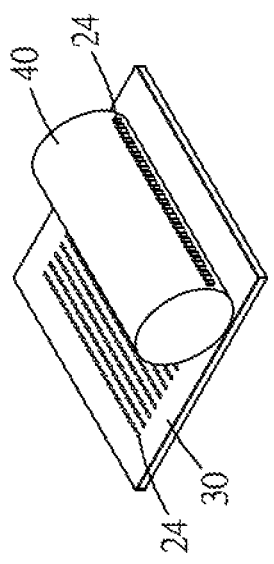
FIGS. 6A to 6D are schematic diagrams showing some aspects of the procedure of picking up in batch of FIGS. 2 and 4.
Figure 6B:
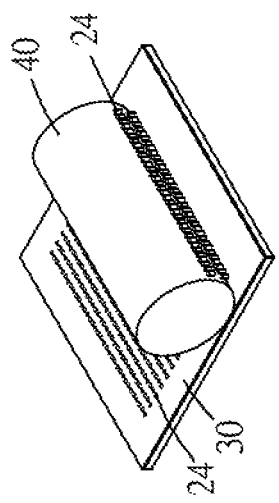
Figure 6C:
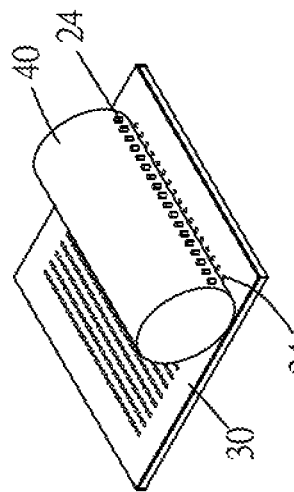
Figure 6D:
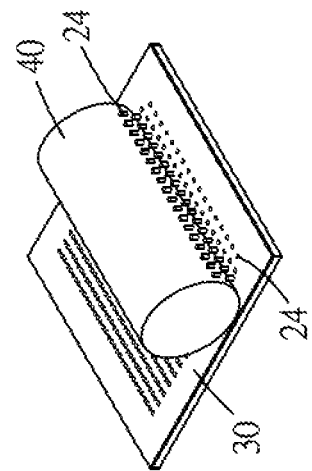

In the second embodiment with reference to FIGS. 4, 5A and 5B, before the step S30, a step S10 is performed to prepare a semiconductor device 20.

As shown in FIGS. 4, 5A and 5B, the step S10 at least includes two steps S12 and S14. The step S12 is to provide a native substrate 22 grown with a structural layer 240 (see FIG. 5A), and the step S14 is to perform a following manufacturing process with the structural layer 240 to form a plurality of micro semiconductor structures 24 in an array on the native substrate 22 (see FIG. 5B). The steps of preparing the structural layer 240 and forming a plurality of micro semiconductor structures 24 may not be continuous steps. In other words, the steps S12 and S14 can be not consequent steps, and an additional step or additional steps can be performed between the steps S12 and S14. The structural layer 240 and the array-type micro semiconductor structures 24 have the same first surface 242s and the same second surface 244s. The first surface 242s of the array-type micro semiconductor structures 24 is defined by the micro semiconductor structures 242, and the first surface 242s of the array-type micro semiconductor structures 24 is attached to the native substrate 22. The second surface 244s of the array-type micro semiconductor structures 24 is opposite to the first surface 242s and defined by the electrodes 244.

In the steps S30 and S40, the examples of the adhesive material 30 can be various depending on the material properties, the types of the micro LEDs, or the methods for removing the native substrate 22, and will described in other embodiments.

Referring to FIGS. 4, 3E and 3F, the step S50 at least includes two steps S52 and S54. The step S52 is to approach the attaching roller 40 toward the array-type micro semiconductor structures 24, wherein the attaching roller 40 continuously and alternately processes linear contacts with the array-type micro semiconductor structures 24, so that the attaching roller 40 picks up the micro semiconductor structures 24 in batch from the adhesive material 30 as the linear contacts are processed (see FIG. 3E). The step S54 is to keep rolling the attaching roller 40 and approaching the attaching roller 40 to the target substrate 50 to continuously process linear contacts with the target substrate 50, wherein the micro semiconductor structures 24 picked up in batch are transferred from the attaching roller 40 to the target substrate 50 as long as the linear contacts are processed (see FIG. 3F).

At least one attaching coplanar surface is defined on the attaching roller 40 along the depth (or height), and the attaching coplanar surface is formed by at least one set of a prepared pattern array. Generally, in order to pick up various array-type micro semiconductor structures from different semiconductor devices 20 (e.g. the array-type micro LED structures of different colors), the attaching roller 40 is configured with a set of pattern array along a predetermined depth (or height) for picking up a set/type of micro semiconductor structures in batch. Besides, the attaching roller 40 is further configured with another set of pattern array along another predetermined depth (or height) for picking up another set/type of micro semiconductor structures in batch. In this embodiment, the attaching roller 40 can be configured with two or more sets of pattern array. For example, the first set of pattern array is corresponding to array-type blue micro LED structures, the second set of pattern array is corresponding to array-type red micro LED structures, and the third set of pattern array is corresponding to array-type green micro LED structures. In general, the pattern array and set number of the pattern array are determined according to the design of the target substrate 50. Similarly, at least one receiving coplanar surface is defined on the target substrate 50 along the depth (or height). In general, the target substrate 50 is at least configured with a thin-film substrate 52 and a plurality of conductive portions 54 disposed on the thin-film substrate 52. The receiving coplanar surface is usually formed by the conductive portions 54. The conductive portions 54 can include metal electrodes, which is prefusible and is attachable. Moreover, the conductive portions 54 may further include solders or similar attaching materials preset on the metal electrodes. Generally, the pattern array of the attaching coplanar surface is corresponding to the receiving coplanar surface. To be noted, the above description of the pattern array is an example of the attaching roller 40, which has at least one attaching surface, and is not for limiting the scope and explanation of the attaching roller 40 and the attaching coplanar surface thereof, and the details of the pattern array will not be further explained here.

As the attaching roller 40 is rolling, the second surface 244s of the array-type micro semiconductor structures 24 can be temporarily attached to the attaching coplanar surface of the attaching roller 40, and the first surface 242s of the array-type micro semiconductor structures 24 is detached from the adhesive material 30. Then, the attaching roller 40 is kept rolling and approached toward the target substrate 50. As the attaching roller 40 is kept rolling, a linear contact is generated between the attaching roller 40 and the target substrate 50. Then, the array-type micro semiconductor structures 24, which is temporarily attached to the attaching coplanar surface of the attaching roller 40, are transferred from the second surface 244s to the target substrate 50 and released from the attaching roller 40.

In this disclosure, the term "pick up in batch" is to pick up at least a part of at least one row of the micro semiconductor structures 24. In some embodiments, to pick up in batch can be to pick up a row of micro semiconductor structures 24 (see FIG. 6A), to pick up a plurality of rows of micro semiconductor structures 24 (see FIG. 6B), to pick up a part of a row of micro semiconductor structures 24 (see FIG. 6C), to pick up a part of a plurality of rows of micro semiconductor structures 24 (see FIG. 6D), or any combination of the above. Similarly, to pick up in batch is usually determined by the design requirement of the target substrate 50. These examples are for illustrations only and not to limit the explanation of the term "pick up in batch", and the aspects of the term "pick up in batch" will not be further discussed hereinafter.

In order to finish the step of "picking up in batch", an initial adhering force is defined between the adhesive material 30 and the array-type micro semiconductor structures 24 in the step S20, a pre-adhering force is defined between the adhesive material 30 and the array-type micro semiconductor structures 24 before the step S40, a picking adhering force is defined between the attaching roller 40 and the array-type micro semiconductor structures 24 in the step S40, a receiving adhering force is defined between the array-type micro semiconductor structures 24 and the target substrate 50 in the step S40. Accordingly, when the continuous linear contacts are generated between the attaching roller 40 and the array-type micro semiconductor structures 24, the picking adhering force is provided between the attaching coplanar surface and the array-type micro semiconductor structures 24, which are picked up in batch. When the continuous linear contacts are generated between the array-type micro semiconductor structures 24 and the target substrate 50, the receiving adhering force is provided between the receiving coplanar surface and the array-type micro semiconductor structures 24, which are transferred in batch.

If all materials are not affected by the environmental conditions (e.g. temperature, humidity, illumination, etc.) and remain the original properties (ideal condition), the pre-adhering force is at least not less than the initial adhering force. In order to achieve the disclosed "pick up in batch", the picking adhering force is at least greater than the pre-adhering force, and the receiving adhering force is at least greater than the picking adhering force.

Third to Fifth Embodiments

FIGS. 7A and 8A to 8C show the third and fourth embodiments of this disclosure, wherein the array-type micro semiconductor structures 24 are disposed at different positions on the adhesive material 30. The steps referring to similar indications and functions of FIG. 1 or 3 will use the same reference numbers. The third to fifth embodiments only focus on the preparation of the adhesive material and the array-type micro semiconductor structures disposed thereon, and the material of the adhesive material is not limited.

Third Embodiment

Figure 7B:
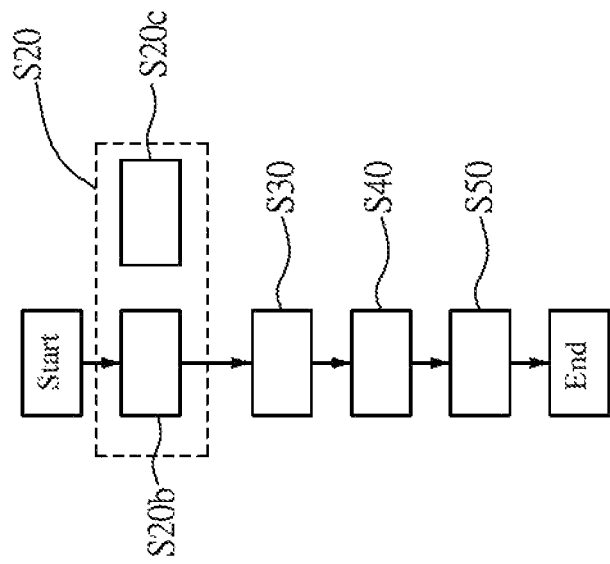
FIG. 7B is a flow chart of a method of batch transferring micro semiconductor structures according to a fourth embodiment and a fifth embodiment of the disclosure.
Figure 7A:
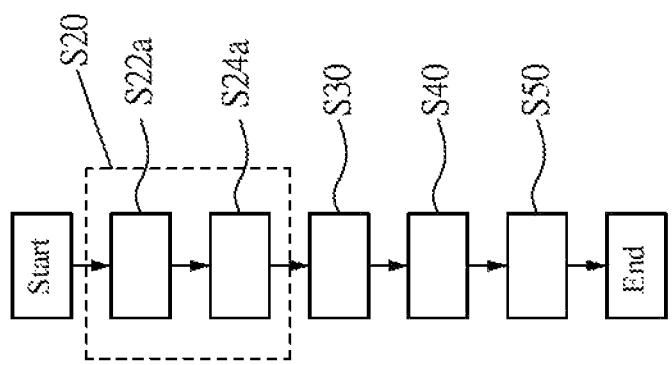
FIG. 7A is a flow chart of a method of batch transferring micro semiconductor structures according to a third embodiment of the disclosure.
Figure 8A:
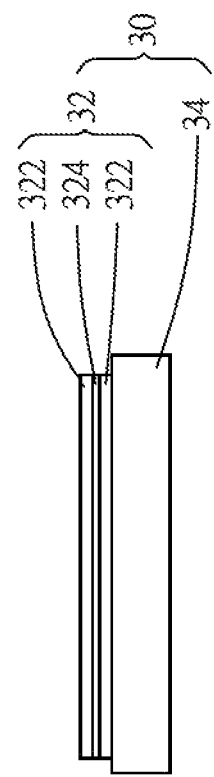
FIG. 8A is a schematic diagrams showing a part of the manufacturing process of FIG. 7A.

Referring to FIGS. 7A and 8A, before the step S30, a step S20 is to preparing an adhesive material 30, which includes at least one glue layer 322. The step S20 at least includes two steps S22a and S24a. The step S22a is to dispose two glue layers 322 on a top surface and a bottom surface of a base layer 324, respectively, so as to form a composition layer 32. The step S24a is to attach a transferring substrate 34 on one of the glue layers 322. Accordingly, the two glue layers 322, the base layer 324 and the transferring substrate 34 together form the adhesive material 30. The configuration of the transferring substrate 34 can keep the composition layer 32 (including two glue layers 322 and one base layer 324 therebetween) in a planar status. The base layer 324 can be made of a material with enough hardness for applying the glue layers 322 (e.g. a plastic film), and the transferring substrate 34 can be made of a material with enough hardness for supporting the composition layer 32 (e.g. a glass substrate).

Fourth and Fifth Embodiments

Figure 8B:
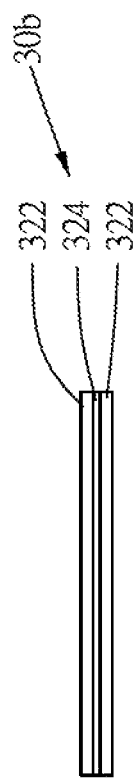
FIGS. 8B and 8C are schematic diagrams showing some manufacturing processes of FIG. 7B.
Figure 8C:
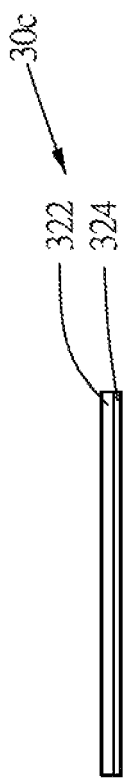

Referring to FIGS. 7B, 8B and 8C, before the step S30, a step S20 (S20b or S20c) is to preparing an adhesive material 30, which includes at least one glue layer 322. The difference between the steps S20b and S20c is in the method to form the adhesive layer and the contained layers of the adhesive layer. In the fourth embodiment as shown in FIG. 8B, the step S20b is performed to substitute the step S20. In the step S20b, two glue layers 322 are disposed on a top surface and a bottom surface of a base layer 324, respectively, so as to form an adhesive material 30b. In the fifth embodiment as shown in FIG. 8C, the step S20c is performed to substitute the step S20. In the step S20c, a glue layer 322 is disposed on a top surface or a bottom surface of a base layer 324 so as to form an adhesive material 30c.

Sixth Embodiment

FIGS. 9 and 10A to 10G show a sixth embodiment of this disclosure, wherein the adhesive material is prepared by another material. The steps referring to similar indications and functions of FIG. 1 or 3 will use the same reference numbers.

To make this disclosure more comprehensive, the complete manufacturing process of this disclosure will be described with reference to FIGS. 9 and 10A to 10G In the sixth embodiment, for example, the micro semiconductor structures are blue micro LED dies, the adhesive material is UV tape, and the electrode of the micro semiconductor structure is a horizontal electrode.

In the sixth embodiment, the method of batch transferring micro semiconductor structures includes steps S10, S20, S30, S40d, and S50.

The step S10 is to prepare a semiconductor device 20d (FIG. 10A). The semiconductor device 20d includes a native substrate 22d, and array-type micro semiconductor structures 24d grown on the native substrate 22d. In this embodiment, the native substrate 22d is a sapphire substrate, and the array-type micro semiconductor structures 24d are configured with a first surface 242s attaching to the native substrate 22d (see FIG. 10D) and a second surface 244s disposed opposite to the first surface 242s (see FIG. 10D).

The step S20 is to prepare an adhesive material 30d, which includes an attaching layer 32d and a transferring substrate 34d. The attaching layer 32d is disposed on the transferring substrate 34d. The glue layer of the attaching layer 32d is a UV tape. The transferring substrate 34d can be a glass substrate for keeping the adhesive material 30d planar.

The order of the steps S10 and S20 is not limited.

The step S30 is to flip the array-type micro semiconductor structures 24, which is disposed on the semiconductor device 20d, and to attach them to the attaching layer 32d of the adhesive material 30d (see FIG. 10C).

The step S40d is to remove the native substrate 22d (see FIGS. 10D and 10E), so that the array-type micro semiconductor structures 24d can be remained on the attaching layer 32d and kept in a planar status (due to the transferring substrate 34d). The step S40d at least includes two steps S42d and S44d.

The step S42d is to remove the native substrate 22d (sapphire substrate) by laser lift-off (LLO) (see FIG. 10D) so as to expose the first surface 242s of the array-type micro semiconductor structures 24d (see FIG. 10E). In the sixth embodiment, when the native substrate 22d is removed by LLO, the initial adhering force is not less than the impact to the array-type micro semiconductor structures 24d generated by LLO. Accordingly, the array-type micro semiconductor structures 24d can be remained on the adhesive material 30d.

The step S44d is performed along with or after the step S42d. The step S44d is to provide UV light for curing the UV tape of the adhesive material 30d (see FIG. 10F), so the initial adhering force between the adhesive material 30d and the array-type micro semiconductor structures 24d can be decreased to the pre-adhering force. Accordingly, the attaching roller 40d can pick up the array-type micro semiconductor structures 24d in batch.

To be noted, the step S44d can be either performed or not depending on that whether the picking adhering force between the attaching roller 40d and the array-type micro semiconductor structures 24d is greater than the initial adhering force between the adhesive material 30d and the array-type micro semiconductor structures 24d or not. If the picking adhering force is greater than the initial adhering force, which means that the pre-adhering force is equal to the initial adhering force, the step for decreasing the initial adhering force to the pre-adhering force can be omitted.

The step S50 is to provide and roll an attaching roller 40d for picking up the micro semiconductor structures 24d in batch from the adhesive material 30d (see FIG. 10F) and transferring the array-type micro semiconductor structures 24d in batch to the target substrate 50d (see FIG. 10G). In this embodiment, the receiving adhering force between the array-type micro semiconductor structures 24d and the target substrate 50d is greater than the picking adhering force between the attaching roller 40d and the array-type micro semiconductor structures 24d.

As the attaching roller 40d is rolling and alternately processing the linear contacts between the array-type micro semiconductor structures 24d and the target substrate 50d, the array-type micro semiconductor structures 24d can be continuously selected in batch.

Seventh Embodiment

Figure 11:
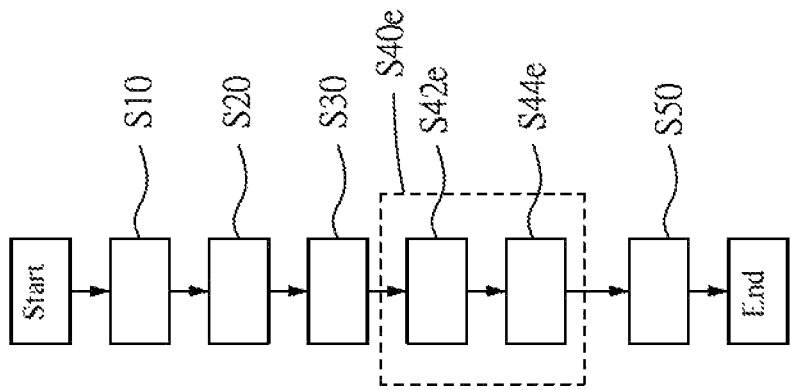
FIG. 11 is a flow chart of a method of batch transferring micro semiconductor structures according to a seventh embodiment of the disclosure.
Figure 9:
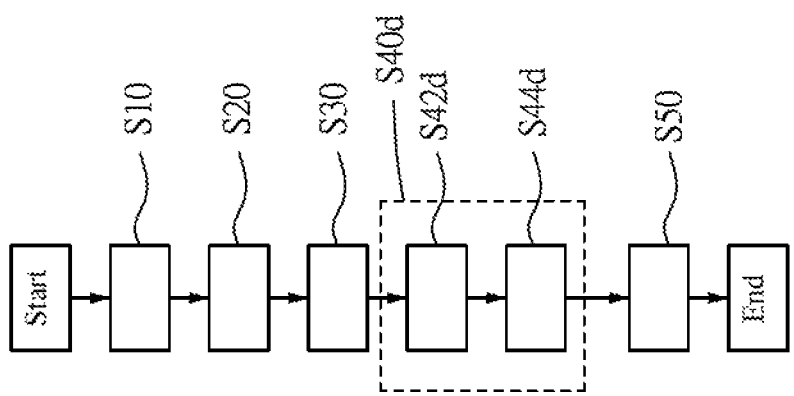
FIG. 9 is a flow chart of a method of batch transferring micro semiconductor structures according to a six embodiment of the disclosure.
Figure 14:
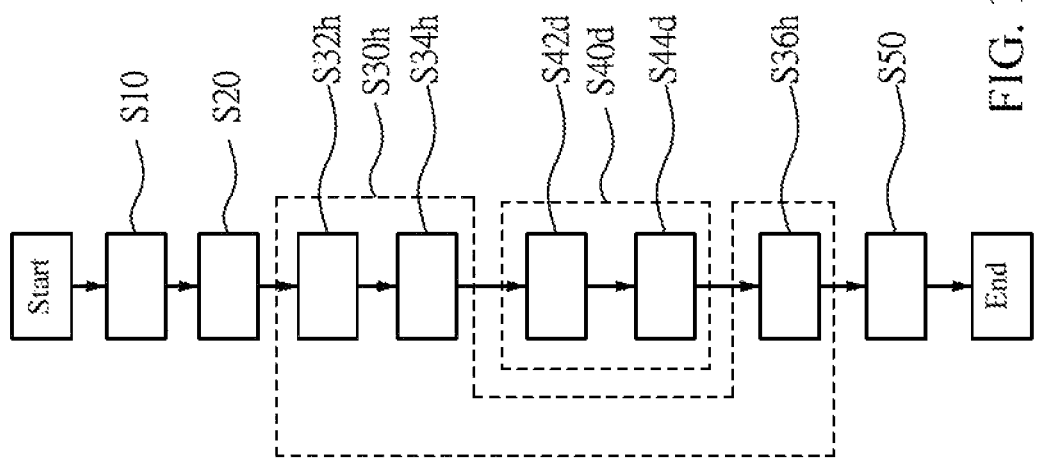
FIG. 14 is a flow chart of a method of batch transferring micro semiconductor structures according to a tenth embodiment of the disclosure.

FIG. 11 shows a method of batch transferring micro semiconductor structures according to a seventh embodiment of this disclosure. The steps referring to similar indications and functions of the sixth embodiment will use the same reference numbers.

In the seventh embodiment, the adhesive material is made of thermal tape for example, and the step S40d is substituted by the step S40e. The step S40e at least includes two steps S42e and S44e.

The step S42e is to remove the native substrate 22d (sapphire substrate) by LLO, so that the native substrate 22d is detached from the first surface 242s of the array-type micro semiconductor structures 24d. After the step S42e, the step S44e is to heat the attaching layer 32d containing the thermal tape, so that the attaching layer 32d is foamed so as to decrease the initial adhering force to the pre-adhering force. Accordingly, the attaching roller 40d can pick up the array-type micro semiconductor structures 24d in batch.

To be noted, the step S44e can also be either performed or not depending on that whether the picking adhering force between the attaching roller 40 and the array-type micro semiconductor structures 24 is greater than the initial adhering force between the adhesive material 30 and the array-type micro semiconductor structures 24 or not.

Eighth and Ninth Embodiments

Figure 12:
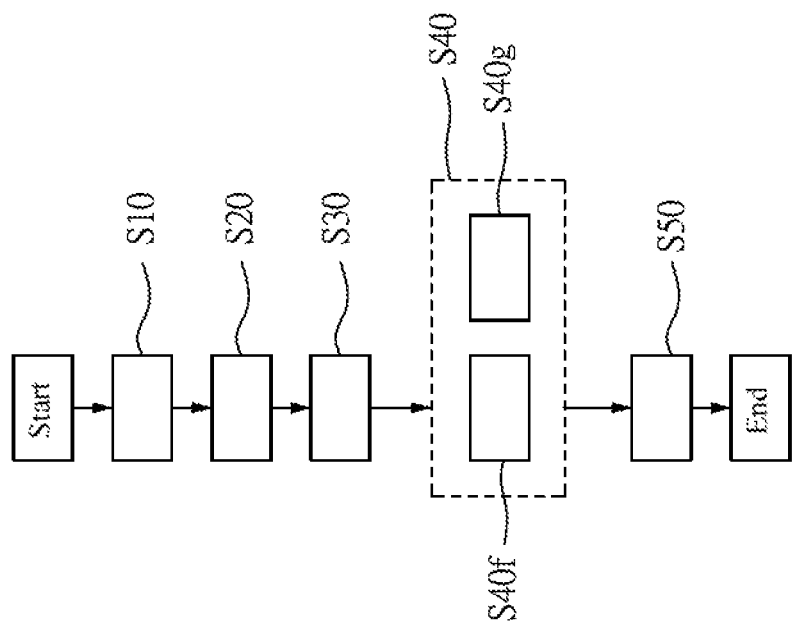
FIG. 12 is a flow chart of a method of batch transferring micro semiconductor structures according to an eighth embodiment and a ninth embodiment of the disclosure.
Figure 13A:
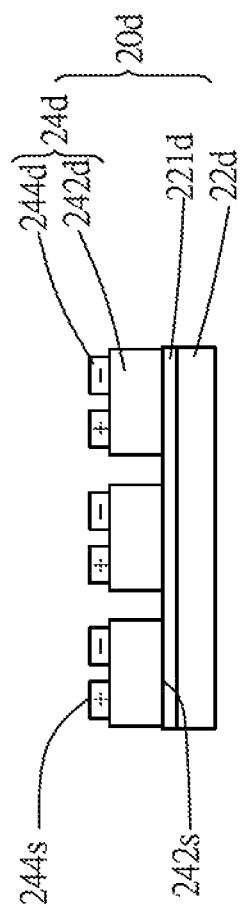
FIGS. 13A and 13B are schematic diagrams showing some manufacturing processes of FIG. 12.
Figure 13B:
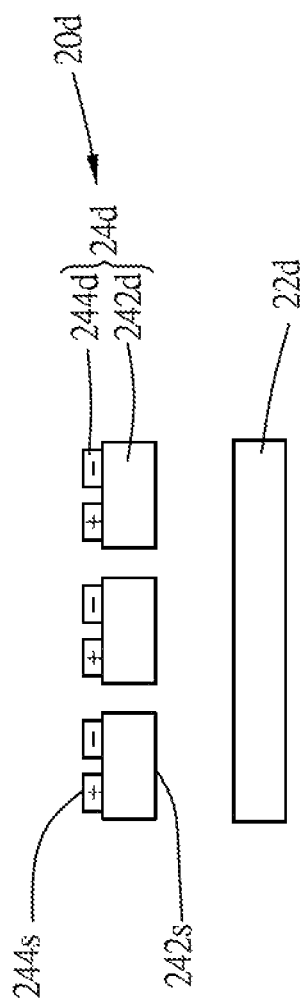
Figure 19:
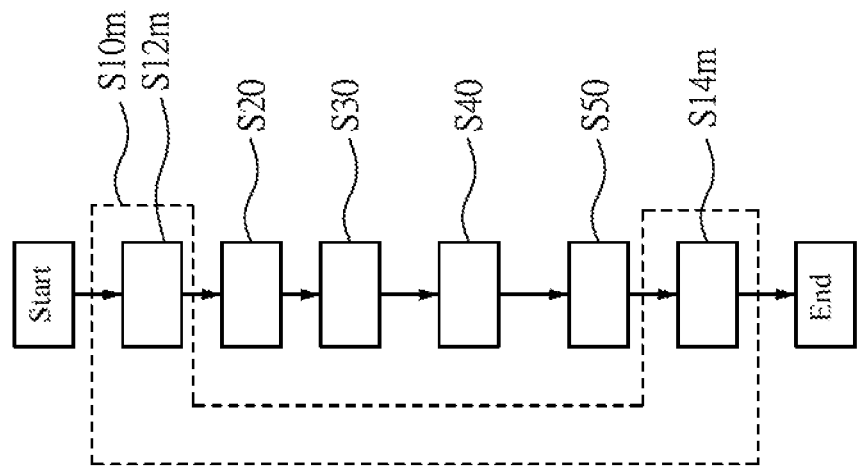
FIG. 19 is a flow chart of a method of batch transferring micro semiconductor structures according to a fourteenth embodiment of the disclosure.

FIGS. 12, 13A and 13B show an eighth embodiment and a ninth embodiment of this disclosure, wherein the semiconductor device is prepared by another material. The steps referring to similar indications and functions of the sixth embodiment will use the same reference numbers.

In the eighth and ninth embodiments, for example, the micro semiconductor structures are red micro LED dies, the adhesive material is UV tape, and the electrode of the micro semiconductor structure is a horizontal electrode.

In the eighth embodiment, the native substrate 22d of the semiconductor device 20d is a GaAs substrate, and the step S40f is performed to substitute the above step S40d. The step S40f is to etch the native substrate 22d (GaAs substrate) according to a predetermined etch selectivity. After the etching, the array-type micro semiconductor structures 24d is still attached on the adhesive material 30d.

In the ninth embodiment, the semiconductor device 20d includes a GaAs substrate 22d and a bonding layer 221d (see FIG. 13A), and the step S40g is performed to substitute the above step S40f. The bonding layer 221d is configured to connect the GaAs substrate 22d and the array-type micro semiconductor structures 24d. The step S40g is to etch the bonding layer 221d according to a predetermined etch selectivity, so that the GaAs substrate 22d can be detached from the array-type micro semiconductor structures 24d (see FIG. 13B).

Tenth Embodiment

FIGS. 14 and 15A to 15G show a tenth embodiment of this disclosure, wherein the adhesive material is applied to the semiconductor device 20*d* by a supporting frame. The steps referring to similar indications and functions of the sixth embodiment will use the same reference numbers.

To make this embodiment more comprehensive, for example, the micro semiconductor structures are blue micro LED dies, the native substrate 22*d* is a sapphire substrate, the adhesive material is UV tape, and the electrode of the micro semiconductor structure is a horizontal electrode.

In the tenth embodiment, the method of batch transferring micro semiconductor structures includes the steps S10, S20, S30*h*, S40*d*, and S50. The steps of the tenth embodiment, which are different from the steps of the sixth embodiment, will be further described hereinafter.

The step S10 is to prepare a semiconductor device 20*d* (see FIG. 15A), which includes a native substrate 22*d* containing the array-type micro semiconductor structures 24*d*.

The step S30*h* at least includes three steps S32*h*, S34*h*, and S36*h*.

The step S32*h* is to prepare a supporting frame 26*d* disposed around the periphery of the array-type micro semiconductor structures 24*d*.

The supporting frame 26 can be configured to contact with, dispose adjacent to, or depart from the native substrate 22*d*, or to dispose adjacent to or depart from the array-type micro semiconductor structures 24*d*. This disclosure is not limited.

In this embodiment, the height and hardness of the supporting frame 26*d* must be enough to support the adhesive material 30*d* to contact the array-type micro semiconductor structures 24*d*. In the tenth embodiment, the supporting frame 26*d* is a metal frame.

The step S34*h* is to attach the adhesive material 30*d* to both of the array-type micro semiconductor structures 24*d* and the supporting frame 26*d* (see FIG. 15C). In the tenth embodiment, the adhesive material 30*d* includes a glue layer coated on at least one surface of a base layer.

The order of the steps S32*h* and S34*h* is not limited.

The step S36*h* is to remove the supporting frame 26*d* before the step S50. In the step S36*h*, the supporting frame 26*d* can be removed by LLO or etching. In the tenth embodiment, the supporting frame 26*d* is removed by etching.

The step S40*d* at least includes two steps S42*d* and S44*d*.

The step S42*d* is to remove the native substrate 22*d* from the array-type micro semiconductor structures 24*d* (see FIG. 15D). In this embodiment, the adhesive material 30*d* is connected to and not detached from the array-type micro semiconductor structures 24*d* through the supporting frame 26*d*.

The step S44*d* is performed along with or after the step S42*d*. The step S44*d* is to perform a process for decreasing the initial adhering force between the adhesive material 30*d* and the array-type micro semiconductor structures 24*d* to the pre-adhering force.

To be noted, the step S44*d* can be performed earlier than the step S36*h*.

The step S50 is to provide and roll an attaching roller 40*d* for alternately processing the linear contacts between the micro semiconductor structures 24*d* and a target substrate 50*d*. Accordingly, as the linear contacts are processed, the attaching roller 40*d* can pick up the micro semiconductor structures 24*d* in batch (see FIG. 15F) and transfer the picked micro semiconductor structures 24*d* to the target substrate 50*d* in batch (see FIG. 15G).

Eleventh and Twelfth Embodiments

Figure 16:
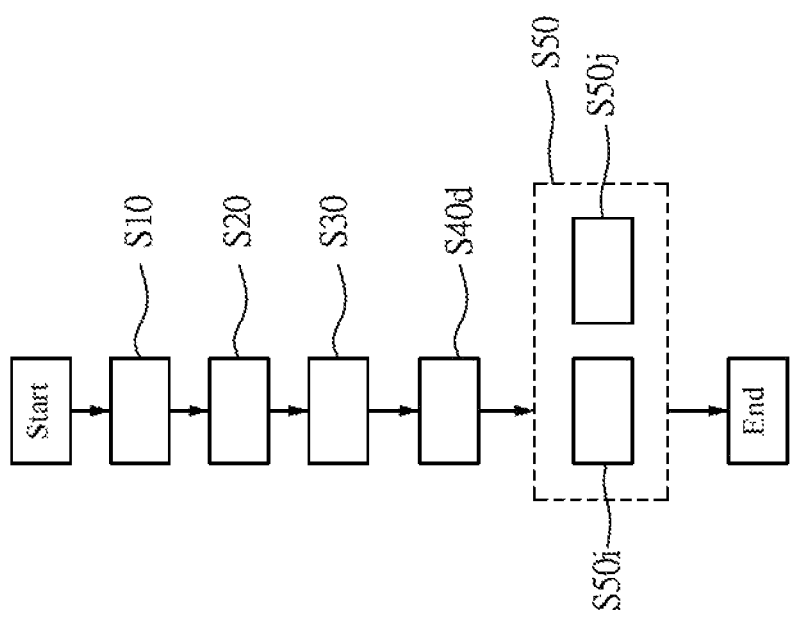
FIG. 16 is a flow chart of a method of batch transferring micro semiconductor structures according to an eleventh embodiment and a twelfth embodiment of the disclosure.
Figure 17B:
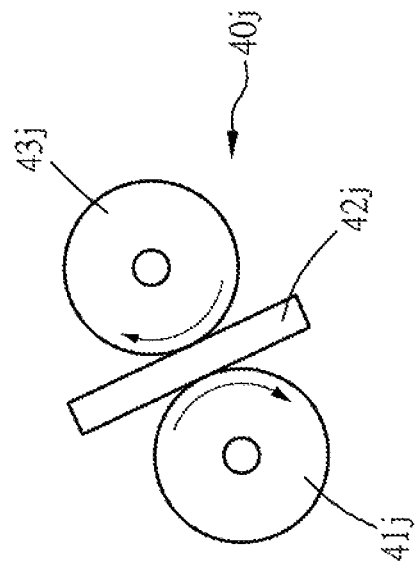
FIGS. 17A and 17B are schematic diagrams showing some manufacturing processes of FIG. 16.
Figure 17A:
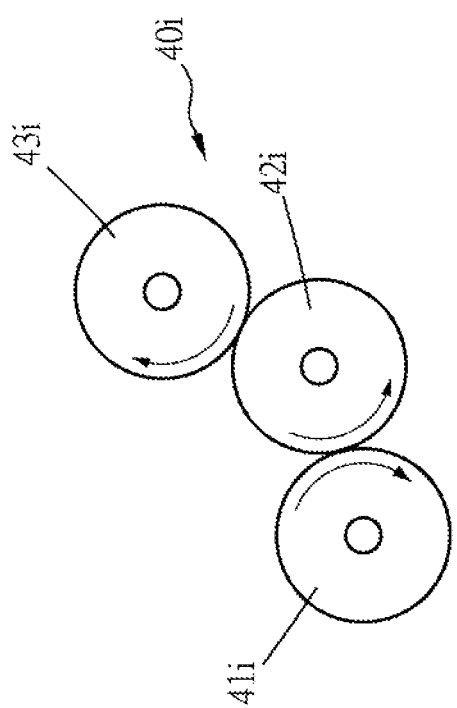

FIGS. 16, 17A and 17B show an eleventh embodiment and a twelfth embodiment of this disclosure, wherein the procedures of picking up and transferring are different. The steps referring to similar indications and functions of the sixth embodiment will use the same reference numbers.

In the eleventh and twelfth embodiments, the method of batch transferring micro semiconductor structures includes the steps S10, S20, S30, S40*d*, and S50. The steps of the eleventh and twelfth embodiments, which are different from the steps of the sixth embodiment, will be further described hereinafter.

In the eleventh embodiment, the step S50*i* is performed to substitute the step S50. Referring to FIGS. 16 and 17A, the step S50*i* is to provide an attaching mechanism 40*i*, which includes a set of attaching rollers 41*i* to 43*i*. The set of attaching rollers 41*i* to 43*i* is provided between the array-type micro semiconductor structures 24*d* and the target substrate 50*d*.

The adjacent two attaching rollers 41*i* and 42*i* generate a roller-roller linear contact, and the adjacent two attaching rollers 42*i* and 43*i* also generate a roller-roller linear contact. Accordingly, the front attaching roller 41*i* can pick up the micro semiconductor structures 24*d* in batch from the adhesive material 30*d*, and the last attaching roller 43*i* can transfer the picked micro semiconductor structures 24*d* to the target substrate 50*d* in batch. In the eleventh embodiment, the adjacent two attaching rollers 41*i* and 42*i* generate a roller-roller linear contact, and the adjacent two attaching rollers 42*i* and 43*i* also generate a roller-roller linear contact.

In the twelfth embodiment, the step S50*j* is performed to substitute the step S50. Referring to FIGS. 16 and 17B, the step S50*j* is to provide an attaching mechanism 40*j*, which includes at least two attaching rollers 41*j* and 43*i*, and an attaching plane 42*j*. In this embodiment, the adjacent attaching roller 41*j* and attaching plane 42*j* generate a roller-plane linear contact, and the adjacent attaching plane 42*j* and attaching roller 43*j* generate a plane-roller linear contact.

Thirteenth Embodiment

Figure 18:
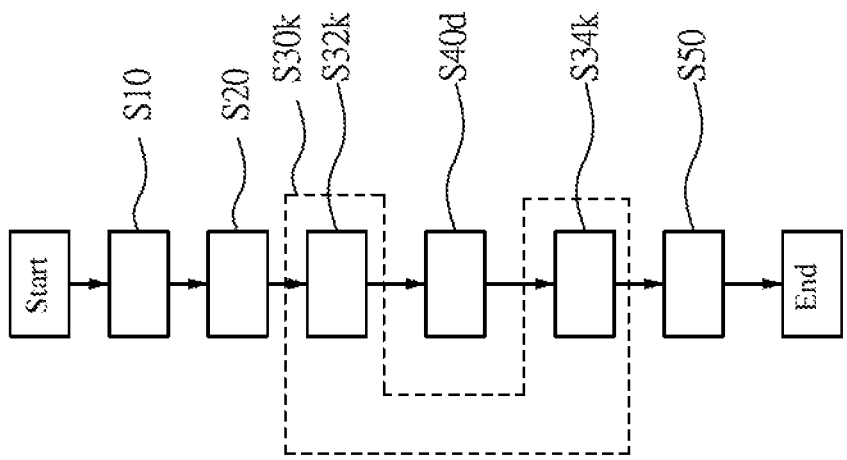
FIG. 18 is a flow chart of a method of batch transferring micro semiconductor structures according to a thirteenth embodiment of the disclosure.

FIG. 18 shows a thirteenth embodiment of this disclosure, wherein the amount of substituted adhesive materials is different. The steps referring to similar indications and functions of the sixth embodiment will use the same reference numbers.

The step S30*k* includes at least two steps S32*k* and S34*k*. The step S32*k* is to attach a first adhesive material on the array-type micro semiconductor structures 24*d* of the semiconductor device 20*d*. After the step S40*d*, the step S34*k* is to attach a second adhesive material on the array-type micro semiconductor structures 24*d* and to remove the first adhesive material. In this embodiment, the type and aspect of the first and second adhesive materials can be referred to the above embodiments.

Fourteenth Embodiment

FIGS. 19, 20A, 20B and 20C show a fourteenth embodiment of this disclosure, wherein the electrode of the micro semiconductor structure is different. To make this embodiment more comprehensive, for example, the electrode of the micro semiconductor structure is a vertical electrode. The steps referring to similar indications and functions of the sixth embodiment will use the same reference numbers The step S10m at least includes two steps S12m and S14m.

Figure 20A:
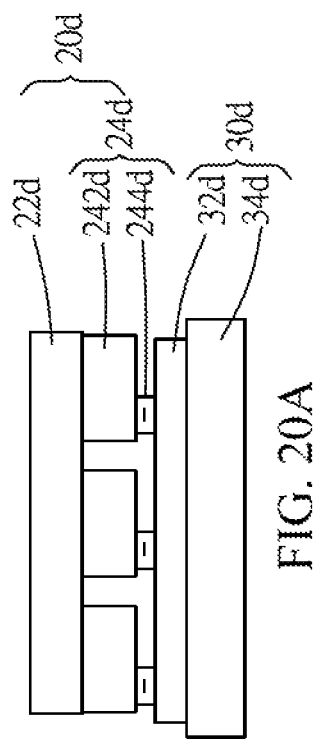
FIGS. 20A, 20B and 20C are schematic diagrams showing some manufacturing processes of FIG. 19.
Figure 20B:
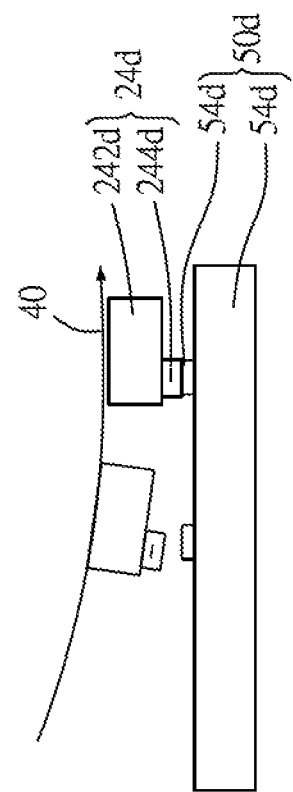

The step S12m is to provide a native substrate 22d, which is grown with array-type micro semiconductor structures 24d (see FIG. 20A, which is similar to FIG. 10C in the sixth Embodiment). Herein, the array-type micro semiconductor structures 24d are only configured with one electrode 244d (either the upper electrode or the lower electrode), and the end of the array-type micro semiconductor structures 24d configured with the electrode 244d is attached to the adhesive material 30d.

The step S50 is to transfer the array-type micro semiconductor structures 24d in batch to the target substrate 50d. Herein, the single electrode 244d is connected to the conductive portion 54d of the target substrate 50d (see FIG. 20B, which is similar to FIG. 10F in the sixth Embodiment).

Figure 20C:
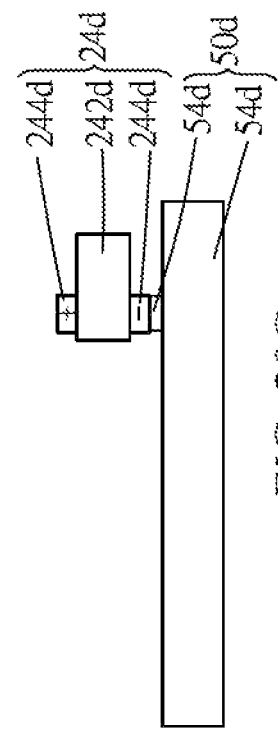

After the step S50, the step S14m is performed to configure another electrode 244d on the array-type micro semiconductor structures 24d (see FIG. 20C, which is similar to FIG. 10G in the sixth Embodiment).

Fifteenth Embodiment to Eighteenth Embodiment

FIGS. 21 to 24 show the fifteenth to eighteenth embodiments of this disclosure, wherein these embodiments have different configurations according to the arrangements shown in Table 1. The steps referring to similar indications and functions of the sixth embodiment will use the same reference numbers. In these embodiments, the array-type micro semiconductor structures 24d and the target substrate 50d can be flexible substrates, which are flexed and attached on an initial roller and a target roller, respectively. To be noted, the drawings are only for illustrations and not to show the actual scales.

In the fifteenth embodiment to the seventeenth embodiment, the roll-to-attach mechanism mainly includes an attaching roller disposed between the array-type micro semiconductor structures 24d and the target substrate 50d. In the eighteenth embodiment, the roll-to-attach mechanism mainly includes an attaching plane disposed between the array-type micro semiconductor structures 24d and the target substrate 50d.

Fifteenth Embodiment

Figure 21:
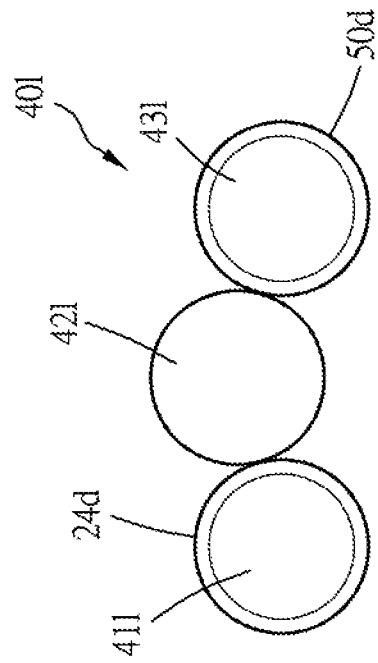
FIG. 21 is a flow chart of a method of batch transferring micro semiconductor structures according to a fifteenth embodiment of the disclosure.

In the fifteenth embodiment, as shown in FIG. 21, the array-type micro semiconductor structures and the attaching unit have a plane-roller linear contact, and the attaching unit and the target substrate have a roller-roller linear contact (arrangement II).

The roll-to-attach mechanism 40k includes an attaching roller 42k, an initial plane 41k and a target roller 43k, which are disposed between the array-type micro semiconductor structures 24d and the target substrate 50d. The initial plane 41k is configured to disposing the array-type micro semiconductor structures 24d, and the target substrate 50d is attached to the surface of the target roller 43k.

Sixteenth Embodiment

Figure 22:
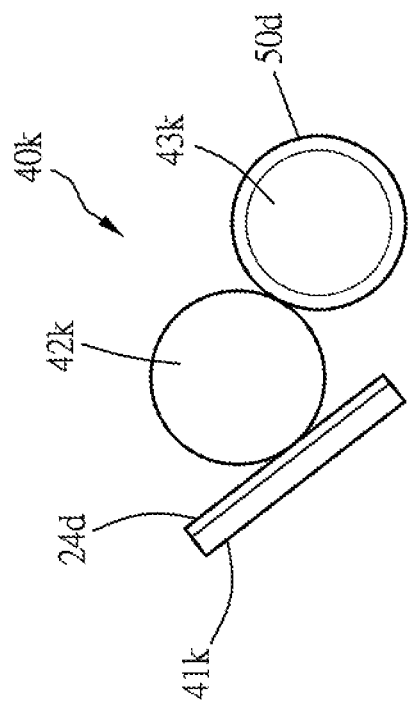
FIG. 22 is a flow chart of a method of batch transferring micro semiconductor structures according to a sixteenth embodiment of the disclosure.

In the sixteenth embodiment, as shown in FIG. 22, the array-type micro semiconductor structures and the attaching unit have a roller-roller linear contact, and the attaching unit and the target substrate have a roller-roller linear contact (arrangement III).

The roll-to-attach mechanism 40l includes an attaching roller 42l, an initial roller 41l and a target roller 43l, which are disposed between the array-type micro semiconductor structures 24d and the target substrate 50d. The array-type micro semiconductor structures 24d is attached to the surface of the initial roller 41l, and the target substrate 50d is attached to the surface of the target roller 43l.

Seventeenth Embodiment

Figure 23:
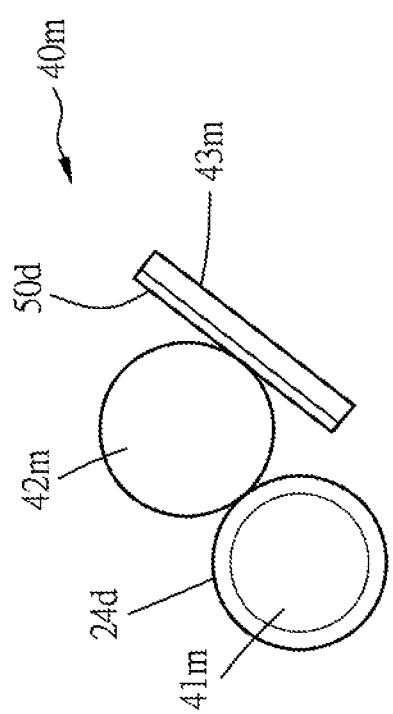
FIG. 23 is a flow chart of a method of batch transferring micro semiconductor structures according to a seventeenth embodiment of the disclosure.

In the seventeenth embodiment, as shown in FIG. 23, the array-type micro semiconductor structures and the attaching unit have a roller-roller linear contact, and the attaching unit and the target substrate have a roller-plane linear contact (arrangement IV).

The roll-to-attach mechanism 40m includes an attaching roller 42m, an initial roller 41m and a target plane 43m, which are disposed between the array-type micro semiconductor structures 24d and the target substrate 50d. The array-type micro semiconductor structures 24d is attached to the surface of the initial roller 41m, and the target substrate 50d is a hard substrate with the target plane 43m. Alternatively, the target substrate 50d is disposed on the target plane 43m.

Eighteenth Embodiment

Figure 24:
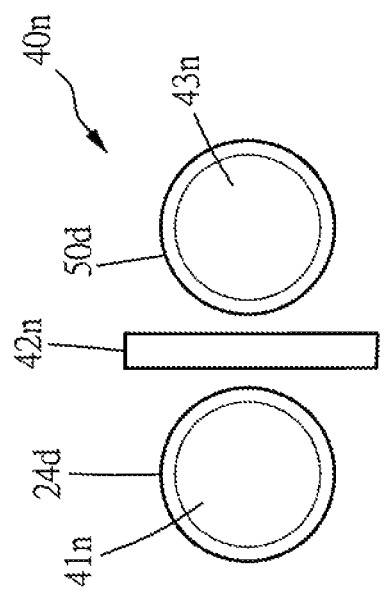
FIG. 24 is a flow chart of a method of batch transferring micro semiconductor structures according to an eighteenth embodiment of the disclosure.

In the eighteenth embodiment, as shown in FIG. 24, the array-type micro semiconductor structures and the attaching unit have a roller-plane linear contact, and the attaching unit and the target substrate have a plane-roller linear contact (arrangement V).

The roll-to-attach mechanism 40n includes an attaching material 42n, an initial roller 41n and a target roller 43n, which are disposed between the array-type micro semiconductor structures 24d and the target substrate 50d. The array-type micro semiconductor structures 24d is attached to the surface of the initial roller 41n, and the target substrate 50d is attached to the surface of the target roller 43n.

Nineteenth Embodiment

Figure 25B:
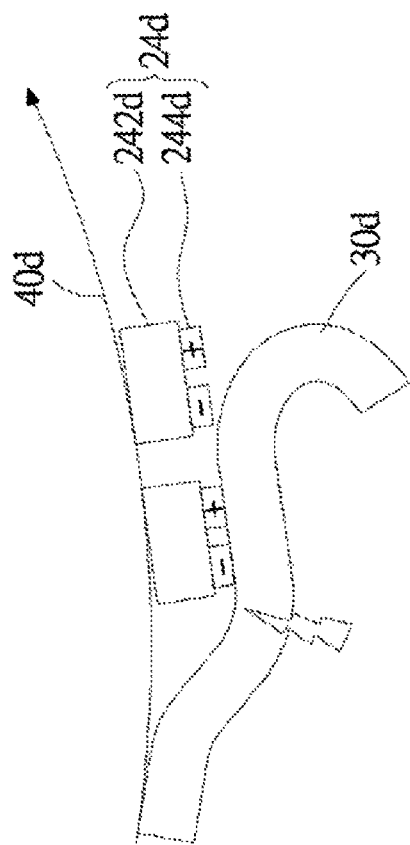
FIGS. 25A and 25B are schematic diagrams showing a method of batch transferring micro semiconductor structures according to a nineteenth embodiment of the disclosure.
Figure 25A:
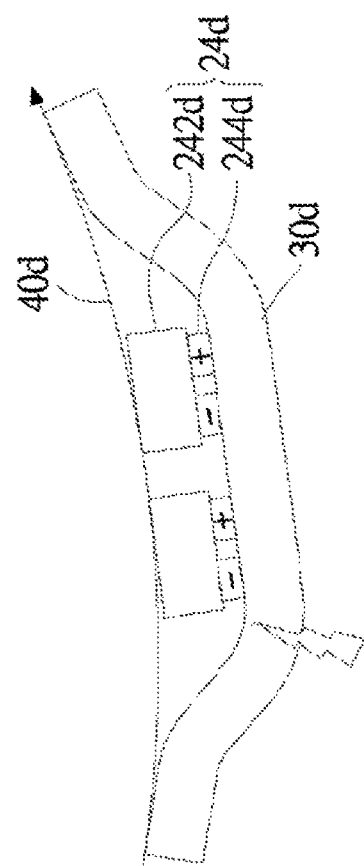

FIGS. 25A to 25B show the nineteenth embodiment of this disclosure, wherein the nineteenth embodiment is a modification of the tenth embodiment. In the nineteenth embodiment, the adhesive material is picked up by the attaching roller 40d along with the array-type micro semiconductor structures 24d. The steps referring to similar indications and functions of the tenth embodiment will use the same reference numbers.

The manufacturing processes of the nineteenth embodiment, which are different from the tenth embodiment, will be described hereinafter.

After the step S36h of removing the supporting frame 26d and the step S42d of removing the native substrate 22d, the attaching roller 40d is rolling and contacting the array-type micro semiconductor structures 24d. Herein, the attaching roller 40d processes linear contacts with the array-type micro semiconductor structures 24d, in which the linear contacts accumulates to form a surface contact, so that the attaching roller 40d picks up the adhesive material 30d as long as the array-type micro semiconductor structures 24d (see FIG. 25A). In this case, the initial adhering force between the array-type micro semiconductor structures 24d and the adhesive material 30d is greater than the picking adhering force between the array-type micro semiconductor structures 24d and the attaching roller 40d. The adhesive material 30d is attached on the array-type micro semiconductor structures 24d, and the array-type micro semiconductor structures 24d are attached to the attaching roller 40d.

The step S44d, which is to decrease the initial adhering force between the adhesive material 30 and the array-type micro semiconductor structures 24 to the pre-adhering force, is finished before the step of tearing out the adhesive material 30d from the array-type micro semiconductor structures 24, which are attached on the attaching roller 40d. When the step S44d is earlier than the step of FIG. 25A, it is needed to ensure that the pre-adhering force between the array-type micro semiconductor structures 24 and the adhesive material 30d is greater than the picking adhering force between the array-type micro semiconductor structures 24 and the attaching roller 40d. Then, a step is performed to decrease the pre-adhering force between the adhesive material 30 and the array-type micro semiconductor structures 24 to a secondary pre-adhering force, and a tearing force, which is less than the picking adhering force and greater than the secondary pre-adhering force, is provided from outside for tearing out the adhesive material 30d from the array-type micro semiconductor structures 24, while the array-type micro semiconductor structures 24 can be still attached to the attaching roller 40d (see FIG. 25B). When the step S44d is after the step of FIG. 25A, it is needed to ensure that the initial adhering force between the array-type micro semiconductor structures 24 and the adhesive material 30d is greater than the picking adhering force between the array-type micro semiconductor structures 24 and the attaching roller 40d. Similarly, after the step S44d, a tearing force, which is less than the picking adhering force and greater than the pre-adhering force, is provided from outside for tearing out the adhesive material 30d from the array-type micro semiconductor structures 24, while the array-type micro semiconductor structures 24d can be still attached to the attaching roller 40d (see FIG. 25B).

The array-type micro semiconductor structures 24, which are attached to the attaching roller 40d and detached from the adhesive material 30d, can continuously generate linear contacts with the target substrate 50d for transferring the array-type micro semiconductor structures 24 in batch to the target substrate 50d (see FIGS. 15F and 15G).

In addition, the nineteenth embodiment can be referred to the first embodiment, but the adhesive material 30 is flexible.

The above embodiments and processes can be modified, substituted, or combined, and can be performed together if the manufacturing conditions are acceptable. Accordingly, the method of batch transferring micro semiconductor structures of this disclosure can effectively and efficiently picking up a batch of or a large amount of micro semiconductor structures 24 (e.g. micro scaled structures or devices) arranged in an array and integrating them to the target substrate 50 (non-native substrate).

In this disclosure, the term "pick up in batch" is to pick up at least a part of at least one row of the micro semiconductor structures 24, the motion of "pick up in batch" can be continuously performed by the attaching roller 40, which continuously performs the rolling motion. In this disclosure, the micro scaled structures/devices are prepared and arranged in an array in advance, and then the batch or large amount picking step is performed. In other words, to arrange the micro scaled structures/devices in an array can provide an effective preparation for the following step of selecting and picking up in batch. According to the embodiments of this disclosure, the "pick up in batch" of the array-type micro scaled structures/devices includes the steps S10 to S50. Each of the steps can be divided into multiple sub-steps, and the sub-steps can be interposed in another major step or change position with another major step. Each step has substituted aspects, which is benefit to expansion or flexibility of the manufacturing processes.

As mentioned above, in the disclosure, the major steps can be substituted, the sub-steps can be divided or substituted, and at least one sub-step can be moved to another major step. These concepts can be rearranged. Accordingly, this disclosure can be applied to different micro LED dies, devices or semi-products, and can be widely applied to the batch or large amount transferring of various micro semiconductor structures.

In summary, the effects of the method of batch transferring micro semiconductor structures of this disclosure includes, but not limited, selecting and applying to the thin, fragile and/or small devices without damaging the devices, effectively and efficiently picking up the micro semiconductor structures in batch (large amount) and transferring them to the target substrate, decreasing the assembling cost, and increasing the production yield. Accordingly, this disclosure can be widely applied to the batch or large amount transferring of various micro semiconductor structures.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A method of batch transferring micro semiconductor structures, comprising:

attaching an adhesive material to a semiconductor device, wherein the semiconductor device comprises a native substrate and array-type micro semiconductor structures grown on the native substrate, and the array-type micro semiconductor structures define a plurality of micro semiconductor structures arranged in an array;

removing the native substrate from the semiconductor device and remaining the array-type micro semiconductor structures on the adhesive material; and providing a roll-to-attach mechanism for alternately processing linear contacts between the array-type micro semiconductor structures and a target substrate, wherein the array-type micro semiconductor structures are optionally picked up in batch from the adhesive material and transferred in batch to the target substrate as the linear contacts are alternately processed;

wherein defining a pre-adhering force between the adhesive material and the array-type micro semiconductor structures; defining a picking adhering force between the roll-to-attach mechanism and the array-type micro semiconductor structures; defining a receiving adhering force between the array-type micro semiconductor structures and the target substrate;

wherein the receiving adhering force is greater than the picking adhering force.

2. The method according to claim 1, wherein:

the roll-to-attach mechanism comprises an attaching roller for performing a rolling motion, and the attaching roller is disposed between the array-type micro semiconductor structures and the target substrate for alternately processing the linear contacts therebetween.

3. The method according to claim 2, wherein:
the step of providing the roll-to-attach mechanism for picking up in batch and transferring in batch further comprises:
keeping at least one of the array-type micro semiconductor structures and the target substrate in a planar surface.

4. The method according to claim 3, wherein:
the roll-to-attach mechanism comprises a target roller for performing a rolling motion, and the target substrate is adjacent to a roller surface of the target roller.

5. The method according to claim 2, wherein:
the roll-to-attach mechanism comprises a start roller for performing a rolling motion, and the array-type micro semiconductor structures are adjacent to a roller surface of the start roller.

6. The method according to claim 5, wherein:
the roll-to-attach mechanism comprises a target roller for performing a rolling motion, and the target substrate is adjacent to a roller surface of the target roller.

7. The method according to claim 2, wherein:
the step of providing the roll-to-attach mechanism for picking up in batch and transferring in batch further comprises:
approaching an attaching roller toward the array-type micro semiconductor structures, wherein the attaching roller continuously and alternately processes linear contacts with the array-type micro semiconductor structures, and the attaching roller picks up the micro semiconductor structures in batch from the adhesive material as the linear contacts are processed; and
keeping the attaching roller rolled and approaching the attaching roller to the target substrate to continuously process linear contacts with the target substrate, wherein the micro semiconductor structures picked up in batch are transferred from the attaching roller to the target substrate as the linear contacts are processed.

8. The method according to claim 2, wherein:
the step of providing the roll-to-attach mechanism for picking up in batch and transferring in batch further comprises:
approaching an attaching roller toward the array-type micro semiconductor structures, wherein the attaching roller continuously and alternately processes linear contacts with the array-type micro semiconductor structures, and the attaching roller picks up at least a row of the micro semiconductor structures from the adhesive material as the linear contacts are processed; and
keeping the attaching roller rolled and approaching the attaching roller to the target substrate to continuously process linear contacts with the target substrate, wherein the row of the picked micro semiconductor structures are transferred from the attaching roller to the target substrate as the linear contacts are processed.

9. The method according to claim 2, wherein:
the step of providing the roll-to-attach mechanism for picking up in batch and transferring in batch further comprises:
approaching an attaching roller toward the array-type micro semiconductor structures, wherein the attaching roller continuously and alternately processes linear contacts with the array-type micro semiconductor structures, and the attaching roller picks up at least a part of at least a row of the micro semiconductor structures from the adhesive material as the linear contacts are processed; and
keeping the attaching roller rolled and approaching the attaching roller to the target substrate to continuously process linear contacts with the target substrate, wherein the at least part of the at least row of the picked micro semiconductor structures are transferred from the attaching roller to the target substrate as the linear contacts are processed.

10. The method according to claim 2, wherein:
the step of providing the roll-to-attach mechanism for picking up in batch and transferring in batch further comprises:
approaching an attaching roller toward the array-type micro semiconductor structures, wherein the attaching roller processes linear contacts with the array-type micro semiconductor structures, in which the linear contacts accumulates to a surface contact, and the adhesive material is carried by the attaching roller picking up the micro semiconductor structures as long as the linear contacts are processed;
tearing out the adhesive material from the micro semiconductor structures attached on the attaching roller; and
keeping the attaching roller rolled and approaching the attaching roller to the target substrate to continuously process linear contacts with the target substrate, wherein the micro semiconductor structures picked up in batch are transferred from the attaching roller to the target substrate as long as the linear contacts are processed.

11. The method according to claim 1, wherein:
in the step of attaching the adhesive material to the semiconductor device, the adhesive material comprises at least one glue layer, and the glue layer is a thermal tape;
before or when the step of providing the roll-to-attach mechanism for picking up in batch and transferring in batch, the method further comprises:
heating the thermal tape so as to decrease the initial adhering force between the adhesive material and the array-type micro semiconductor structures to the pre-adhering force;
wherein the picking adhering force is greater than the pre-adhering force.

12. The method according to claim 1, wherein:
the roll-to-attach mechanism comprises a start roller for performing a rolling motion, a target roller for performing a rolling motion, and an attaching plane disposed between the start roller and the target roller, the array-type micro semiconductor structures are adjacent to a roller surface of the start roller, and the target substrate is adjacent to a roller surface of the target roller.

13. The method according to claim 1, wherein:
before the step of attaching the adhesive material to the semiconductor device, the method further comprises:
disposing two glue layers on a top surface and a bottom surface of a base layer, respectively; and
attaching a transferring substrate on one of the glue layers;
wherein the two glue layers, the base layer and the transferring substrate form the adhesive material.

14. The method according to claim 1, wherein:
before the step of attaching the adhesive material to the semiconductor device, the method further comprises:
disposing a glue layer on at least one surface of a base layer to form the adhesive material.

15. The method according to claim 14, wherein:
the step of attaching the adhesive material to the semiconductor device further comprises:
providing a supporting frame disposed around the array-type micro semiconductor structures; and
attaching the adhesive material to both of the array-type micro semiconductor structures and the supporting frame; and
before the step of providing the roll-to-attach mechanism for picking up in batch and transferring in batch, the method further comprises:
removing the supporting frame.

16. The method according to claim 15, wherein:
the step of providing the roll-to-attach mechanism for picking up in batch and transferring in batch further comprises:
approaching an attaching roller toward the array-type micro semiconductor structures, wherein the attaching roller processes linear contacts with the array-type micro semiconductor structures, in which the linear contacts accumulates to form a surface contact, and the adhesive material is carried by the attaching roller picking up the micro semiconductor structures as long as the linear contacts are processed;
providing a tearing force for tearing out the adhesive material from the micro semiconductor structures attached on the attaching roller; and
keeping the attaching roller rolled and approaching the attaching roller to the target substrate to continuously process linear contacts with the target substrate, wherein the micro semiconductor structures picked up in batch are transferred from the attaching roller to the target substrate as long as the linear contacts are processed;
wherein the picking adhering force is greater than the tearing force.

17. The method according to claim 1, wherein:
the step of removing the native substrate further comprises:
removing the native substrate by laser lift-off or etching;
wherein when removing the native substrate by laser lift-off or etching, the array-type micro semiconductor structures are kept attaching to the adhesive material by an initial adhering force.

18. The method according to claim 1, wherein:
in the step of attaching the adhesive material to the semiconductor device, the adhesive material comprises at least one glue layer, and the glue layer is a UV tape;
before or when the step of providing the roll-to-attach mechanism for picking up in batch and transferring in batch, the method further comprises:
providing a UV light to cure the UV tape so as to decrease the initial adhering force between the UV tape and the array-type micro semiconductor structures to the pre-adhering force;
wherein the picking adhering force is greater than the pre-adhering force.

19. The method according to claim 1, wherein:
the step of attaching the adhesive material to the semiconductor device further comprises:
providing a supporting frame disposed around the array-type micro semiconductor structures; and
attaching the adhesive material to both of the array-type micro semiconductor structures and the supporting frame; and
before the step of providing the roll-to-attach mechanism for picking up in batch and transferring in batch, the method further comprises:
removing the supporting frame.

20. The method according to claim 19, wherein:
the step of providing the roll-to-attach mechanism for picking up in batch and transferring in batch further comprises:
approaching an attaching roller toward the array-type micro semiconductor structures, wherein the attaching roller processes from linear contacts with the array-type micro semiconductor structures, in which the linear contacts accumulates to fotin a surface contact, and the adhesive material is carried by the attaching roller picking up the micro semiconductor structures as long as the linear contacts are processed;
tearing out the adhesive material from the micro semiconductor structures attached on the attaching roller; and
keeping the attaching roller rolled and approaching the attaching roller to the target substrate to continuously process linear contacts with the target substrate, wherein the micro semiconductor structures picked up in batch are transferred from the attaching roller to the target substrate as long as the linear contacts are processed.

21. The method according to claim 1, wherein:
the step of providing the roll-to-attach mechanism for picking up in batch and transferring in batch further comprises:
providing a set of attaching rollers for rolling and alternately processing linear contacts between the array-type micro semiconductor structures and a target substrate, wherein the set of attaching rollers picks up the micro semiconductor structures in batch from the adhesive material and transfers the picked micro semiconductor structures in batch to the target substrate as the alternate linear contacts are processed; wherein the set of attaching rollers comprises a plurality of attaching rollers for performing a rolling motion, any adjacent two of the attaching rollers generate a linear contact, the first attaching roller picks up the micro semiconductor structures in batch from the adhesive material, and the last attaching roller transfers the micro semiconductor structures in batch to the target substrate.

22. The method according to claim 1, wherein:
before the step of attaching the adhesive material to the semiconductor device, the method further comprises:
growing the array-type micro semiconductor structures on the native substrate, wherein the array-type micro semiconductor structures are a plurality of individual micro LED chips.

23. The method according to claim 1, wherein:
before the step of attaching the adhesive material to the semiconductor device, the method further comprises:
growing the array-type micro semiconductor structures on the native substrate, wherein the array-type micro semiconductor structures are a plurality of defined micro semiconductor structures having at least an epitaxy layer.

24. The method according to claim 1, wherein:
when, before, after or upon the step of providing the roll-to-attach mechanism for picking up in batch and transferring in batch:
the array-type micro semiconductor structures on the target substrate are horizontal-electrode micro LED dies.

25. The method according to claim 1, wherein:
when, before, after or upon the step of providing the roll-to-attach mechanism for picking up in batch and transferring in batch:
the array-type micro semiconductor structures on the target substrate are vertical-electrode micro LED dies.

26. A method of batch transferring micro semiconductor structures, comprising:
attaching an adhesive material to a semiconductor device, wherein the semiconductor device comprises a native substrate and array-type micro semiconductor structures grown on the native substrate, and the array-type micro semiconductor structures define a plurality of micro semiconductor structures arranged in an array;
removing the native substrate from the semiconductor device and remaining the array-type micro semiconductor structures on the adhesive material; and
providing a roll-to-attach mechanism for alternately processing linear contacts between the array-type micro semiconductor structures and a target substrate, wherein the array-type micro semiconductor structures are optionally picked up in batch from the adhesive material and transferred in batch to the target substrate as the linear contacts are alternately processed;
wherein the roll-to-attach mechanism comprises an attaching roller for performing a rolling motion, and the attaching roller is disposed between the array-type micro semiconductor structures and the target substrate for alternately processing the linear contacts therebetween;
wherein the step of providing the roll-to-attach mechanism for picking up in batch and transferring in batch further comprises:
approaching an attaching roller toward the array-type micro semiconductor structures, wherein the attaching roller processes linear contacts with the array-type micro semiconductor structures, in which the linear contacts accumulates to a surface contact, and the adhesive material is carried by the attaching roller picking up the micro semiconductor structures as long as the linear contacts are processed;
tearing out the adhesive material from the micro semiconductor structures attached on the attaching roller; and
keeping the attaching roller rolled and approaching the attaching roller to the target substrate to continuously process linear contacts with the target substrate, wherein the micro semiconductor structures picked up in batch are transferred from the attaching roller to the target substrate as long as the linear contacts are processed.

\* \* \* \* \*